United States Patent
Fulghum et al.

(10) Patent No.: US 7,221,958 B2
(45) Date of Patent: May 22, 2007

(54) RECEIVED SIGNAL FILTERING FOR ENHANCED SELECTIVITY

(75) Inventors: Tracy L. Fulghum, Durham, NC (US); William O. Camp, Jr., Chapel Hill, NC (US); Rajaram Ramesh, Cary, NC (US); Yi-Pin Eric Wang, Cary, NC (US)

(73) Assignee: Ericsson Inc., Research Triangle Park, NC (US)

( * ) Notice: Subject to any disclaimer, the term of this patent is extended or adjusted under 35 U.S.C. 154(b) by 1067 days.

(21) Appl. No.: 10/021,378

(22) Filed: Dec. 12, 2001

(65) Prior Publication Data

US 2003/0109277 A1 Jun. 12, 2003

(51) Int. Cl.
*H04M 1/00* (2006.01)

(52) U.S. Cl. .................. 455/552.1; 455/340; 455/296; 455/278.1; 370/320

(58) Field of Classification Search ............... 455/552, 455/562.1, 550.1, 296, 278.1, 306; 370/320, 370/335, 342
See application file for complete search history.

(56) References Cited

U.S. PATENT DOCUMENTS 5,162,900 A * 11/1992 Citta ........................ 348/607
5,774,505 A * 6/1998 Baugh ...................... 375/348

* cited by examiner

*Primary Examiner*—Melur Ramakrishnaiah
(74) *Attorney, Agent, or Firm*—Coats & Bennett, PLLC

(57) ABSTRACT

A delay-and-add filtering technique positions one or more filter nulls substantially at points of narrowband interference in a relatively wideband received signal. For example, the technique is useful in removing adjacent channel interference in a received W-CDMA signal caused GSM radio transmissions.

34 Claims, 6 Drawing Sheets

RECEIVED SIGNAL FILTERING FOR ENHANCED SELECTIVITY

BACKGROUND OF THE INVENTION

The present invention generally relates to radio frequency signals, and particularly relates to received signal filtering.

Wireless receiver performance depends on the receiver's ability to discriminate between received signals within the spectrum of interest and those signals lying "out-of-band." Interference with desired signal reception becomes particularly problematic when the interfering signal or signals are relatively close in frequency to the desired signal.

While all types of RF communication systems are susceptible to varying types of signal interference at the receiver, certain types of systems have heightened susceptibilities. For example, communication system air interfaces based on the Wideband Code Division Multiple Access (W-CDMA) standards use signals that are oftentimes much wider in bandwidth than the other signals with which they must coexist. Wireless communication systems based on the Global System for Mobile Communication (GSM) standards and operating in the 1900 MHz Personal Communication Systems (PCS) band in the International Telecommunication Union (ITU) Region 2 represent a significant potential source of interference for W-CDMA systems. Where W-CDMA and GSM wireless communication networks coexist, the GSM systems place relatively narrowband signals at frequencies close to W-CDMA signal frequencies.

Because W-CDMA receivers are designed to receive wideband signals, designing receiver filters that pass the wideband signal of interest while simultaneously rejecting narrowband signals at the edge of the wideband signal presents significant challenges. These challenges extend beyond the framework of W-CDMA receivers, and it is generally understood that designing pass-band filters with sharp out-of-band cutoffs represents a complex and careful balancing of cost, complexity, and performance.

Existing approaches to receive signal filtering include the use of surface acoustic wave (SAW) filters, analog baseband filters, and various approaches to digital filtering. SAW devices can provide excellent filtering performance, but at the cost of added expense and physical size. The same shortcomings are largely true of other analog-domain signal filtering. Digital filtering, such as by Finite Impulse Response (FIR) filtering also offers decent performance, but as filter performance increases, so too does processing complexity and power consumption.

BRIEF SUMMARY OF THE INVENTION

The present invention provides an apparatus and method for reducing narrowband interference in wideband signals. Delay-and-add filtering techniques provide narrowband attenuation at one or more selected frequencies. The delay-and-add filters produce filter nulls substantially at the same frequencies where narrowband interference is expected. In this manner, delay-and-add filtering may be used to reduce narrowband interference in a received wideband signal, such as in a baseband W-CDMA signal.

In at least some embodiments, delay-and-add filtering is selectively applied to the received signal after it is converted to baseband. That is, baseband processing uses either the baseband signal or a filtered version of the baseband signal. Delay-and-add filtering may be applied based on a known characteristic of the baseband signal, such as a data rate or spreading factor associated with it, or may be based on measured performance. Measured performance might, for example, determine the efficacy of delay-and-add filtering by comparing interference in filtered and non-filtered versions of the baseband signal. If filtering reduces interference, the filtered baseband signal is used in subsequent baseband processing otherwise delay-and-add filtering is not applied to baseband signal. In any case, delay-and-add filtering can be selectively applied to the baseband signal.

Filtering in accordance with at least some embodiments of the present invention is particularly advantageous in W-CDMA receivers. In such receivers, the baseband received signal is a relatively wideband signal subject to one or more sources of interference. For example, GSM-based communication systems operate at air interface frequencies similar to W-CDMA air interface frequencies (e.g., the 1900 MHz radio spectrum). Consequently, narrowband interference from adjacent GSM radio channels can appear at the edges of baseband W-CDMA signals. Since the frequencies associated with this type of narrowband interference are known, a delay-and-add filter may be configured to apply filter nulls at one or more points of expected narrowband interference in the baseband W-CDMA signal.

DETAILED DESCRIPTION OF THE INVENTION

W-CDMA systems provide an exemplary framework for discussing at least some embodiments of the present invention, but it should be understood that the present invention has applicability beyond its use in W-CDMA systems. In general, the present invention provides an approach to removing narrowband interference from a wideband signal that is computationally efficient and economical to implement.

As an example of where narrowband interference might be problematic, consider that wireless communication systems based on W-CDMA standards may use RF spectrum at or close to the 1900 MHz PCS bands. Other wireless communication systems (e.g., GSM-based systems) may occupy essentially the same spectrum, thus raising the possibility that the much wider bandwidth W-CDMA signals will be jammed by one or more narrowband signals.

Figure 1:
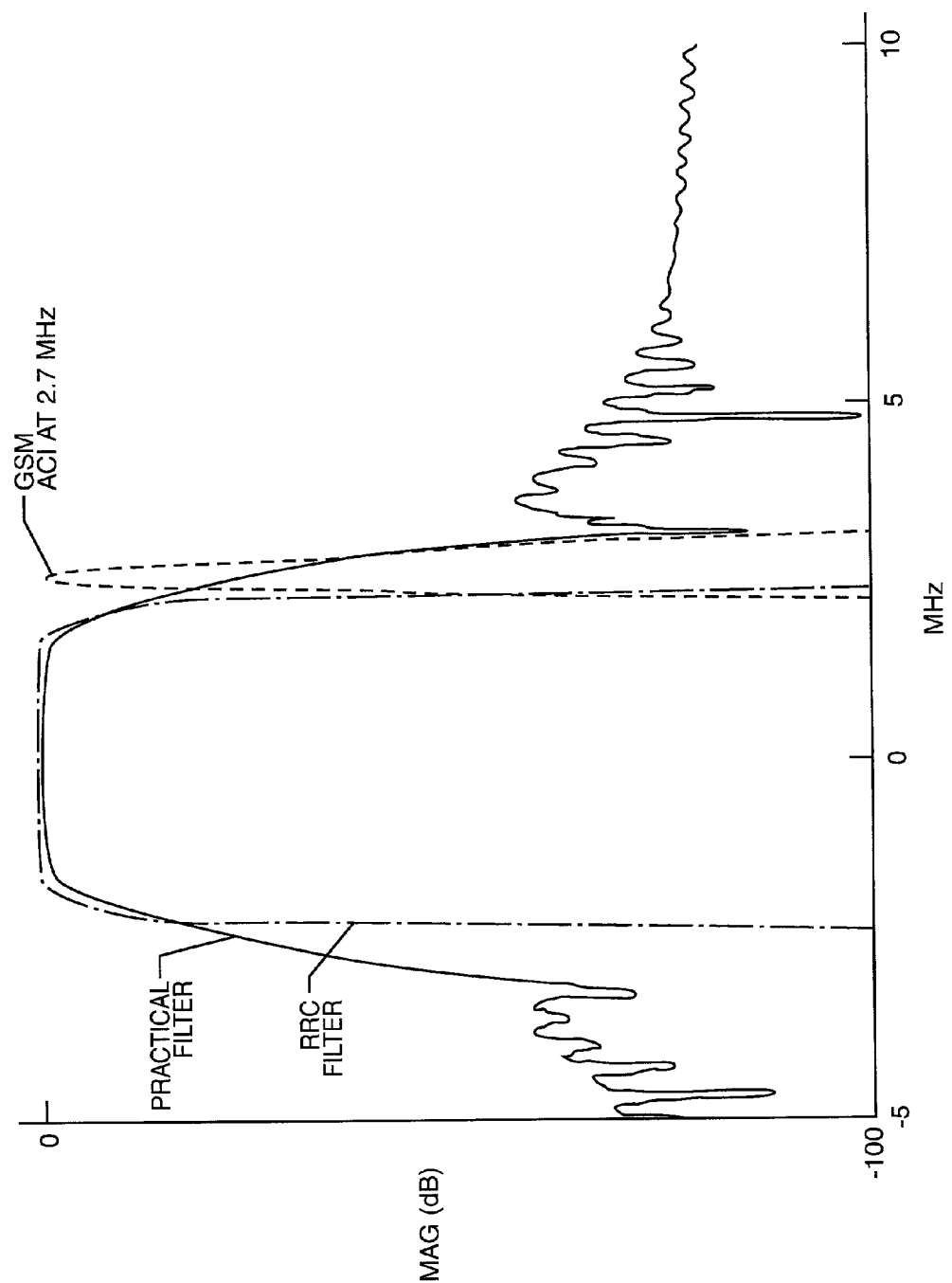
FIG. 1 is a graph of narrowband GSM interference in a wideband W-CDMA signal.

FIG. 1 plots normal analog filter responses for ideal and practical filters as might be used in filtering baseband W-CDMA signals, and additionally plots the spectrum of a typical interfering signal. The frequency offset of the interfering signal relative to the baseband W-CDMA signal is approximately 2.7 MHz, which offset represents the proximity of the closest GSM air interface radio channel likely to interfere with a W-CDMA transmission. As seen in the illustration, practical filtering lacks the sharp filter cut-off characteristics necessary to prevent interference from the adjacent GSM signal in the baseband W-CDMA signal.

Figure 2:
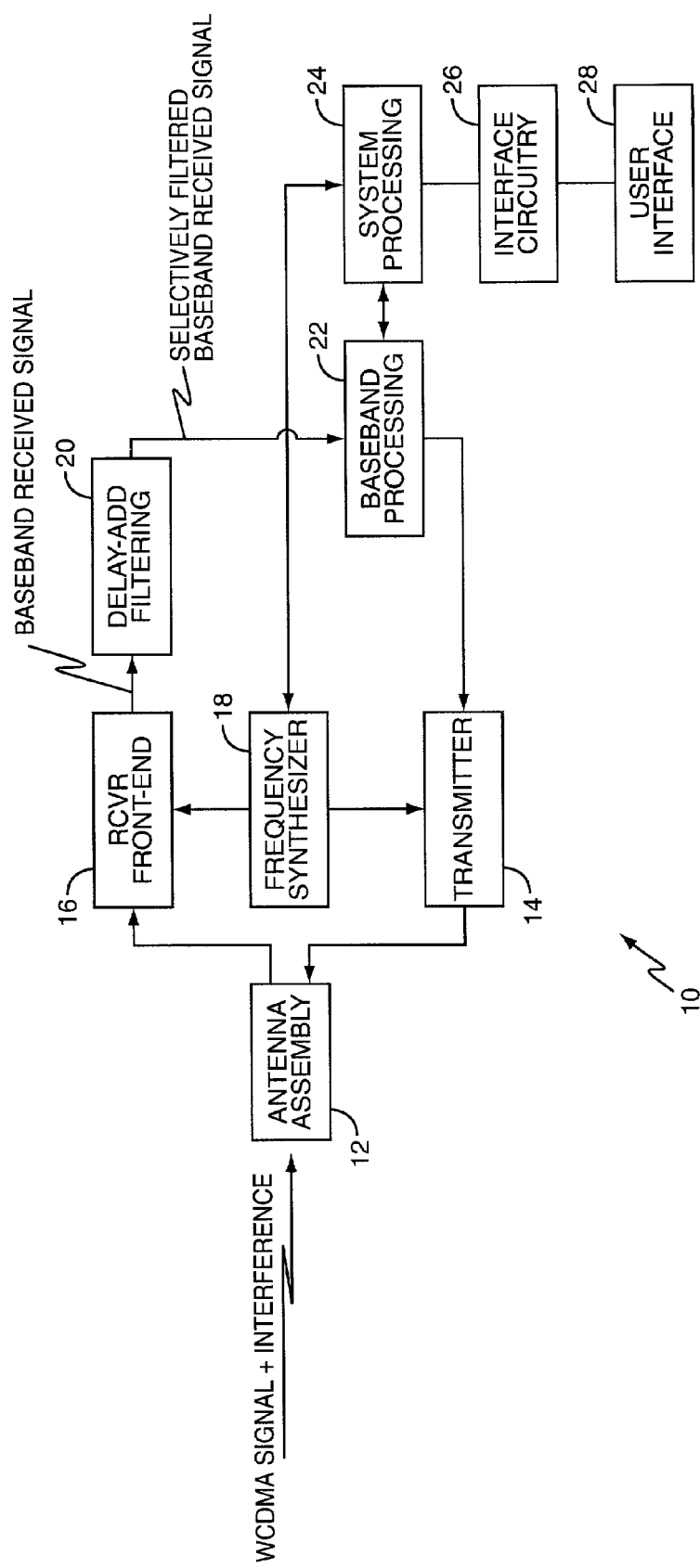
FIG. 2 is a diagram of an exemplary access terminal incorporating an exemplary W-CDMA receiver.

In at least some embodiments, the present invention provides methods and apparatus to create a filter useful for filtering narrowband interference from the baseband signal (sampled data stream) generated by cellular or other wireless communication receivers. FIG. 2 illustrates an exemplary access terminal (AT) 10 supporting wireless communications in a W-CDMA based wireless communication network. The AT 10 comprises RF transmission and reception resources, including an antenna assembly 12, a transmitter 14, and a receiver front-end 16.

The AT 10 receives a W-CDMA signal, possibly corrupted by narrowband interference arising from spectrally nearby GSM transmissions, and other sources of signal interference. The antenna assembly 12 couples the received signal into the receiver front-end 16, where it is typically filtered, amplified, digitized, and downconverted to baseband. Generally, a frequency synthesizer 18 or other device provides one or more reference frequencies to the receiver front-end, which are used in generating the digitized baseband received signal.

In an exemplary embodiment, the baseband signal actually comprises two sample streams, an in-phase "I" sample stream and a quadrature "Q" sample stream. These digitized I and Q sample streams are filtered by filter 20, which in exemplary embodiments, is implemented as a delay-and-add filter, to remove or reduce at least some narrowband interference from them. In at least some embodiments, the AT 10 implements selective filtering of the baseband signal. That is, filtering the I and Q sample streams is selectively performed by filter 20. Exemplary details regarding selective filtering appear later in this discussion.

The output from filter 20 passes to the baseband processor 22, which may comprise one or more signal processors or other processing circuitry. Indeed, the baseband processor 22 might comprise one or more digital signal processors (DSPs) executing coded instructions, or might comprise one or more Application Specific Integrated Circuits (ASICs), or some combination thereof. Further, the baseband processor 22 might integrate receiver and transmitter baseband processing, or might include separate receive and transmit processing. Generally, the "receiver" portion of the AT 10 includes the receiver front-end 16, the filter 20, and relevant baseband processing resources in the baseband processor 22.

Other elements of the exemplary AT 10 are not necessarily germane to the present invention, but bear mentioning in terms of fully describing the AT 10. In addition to the elements described above, the AT 10 includes one or more system processors 24, which may be general-purpose microcontrollers executing coded program instructions, interface circuitry 26, and a user interface 28. Typically, the user interface 28 comprises a display screen, keypad, and audio input/output devices. Thus, the interface circuitry 26 commonly includes D/A and A/D converters, input/output drivers, audio processing circuitry, display and keypad drivers, etc.

Returning focus to the filter 20, the present invention takes advantage of the expected or known frequencies of potential narrowband interference. For example, FIG. 1 illustrated the expected closest or worst GSM interference at a baseband frequency offset of 2.7 MHz. Filter 20 comprises a "delay-and-add" filter architecture where the signal of interest is combined with a delayed version of that same signal. This action produces a series of filter notches or nulls at frequencies dependent on the underlying sampling rate of the signal of interest and the amount of signal delay imparted by the filter. Generally, the transfer function of the delay-and-add filter is given as, $$H(z)=1+z^{-N}, \quad (1)$$

where N represents the number of unit delays introduced in the delay portion of the filter.

In an exemplary embodiment for W-CDMA, the sampling rate of the I and Q sample streams comprising the baseband signal in AT 10 is four times the underlying chip rate of 3.84 MHz. Thus, four times oversampling of the I/Q sample streams yields a sampling rate $f_s$ of 15.36 MHz.

Figure 3:
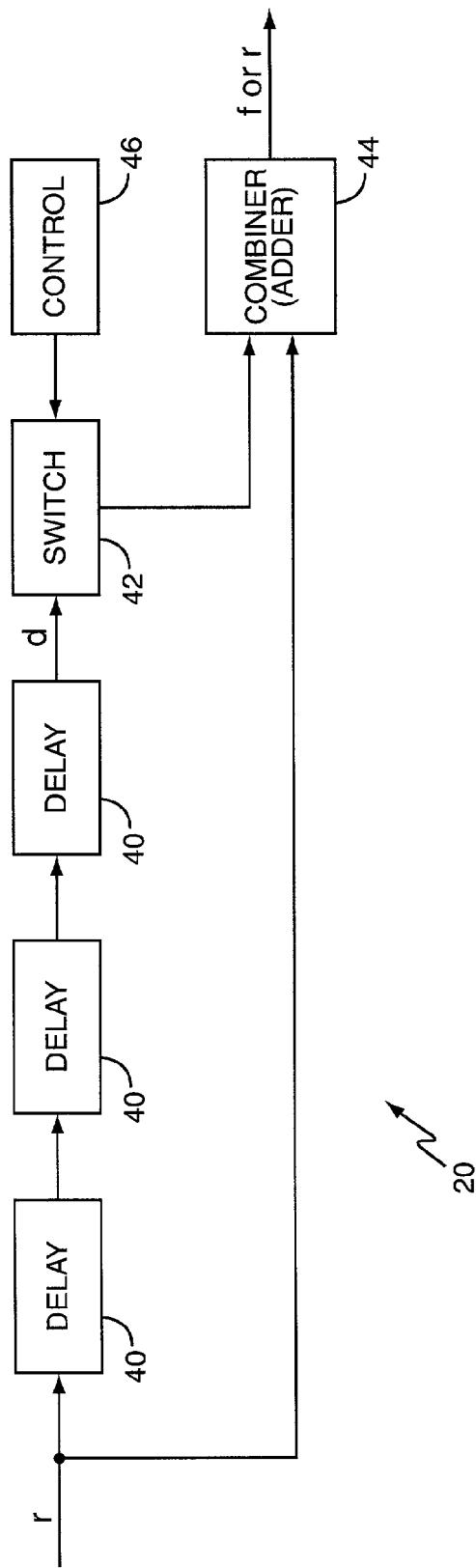
FIG. 3 is a diagram of an exemplary implementation of a delay-and-add filter.
Figure 4:
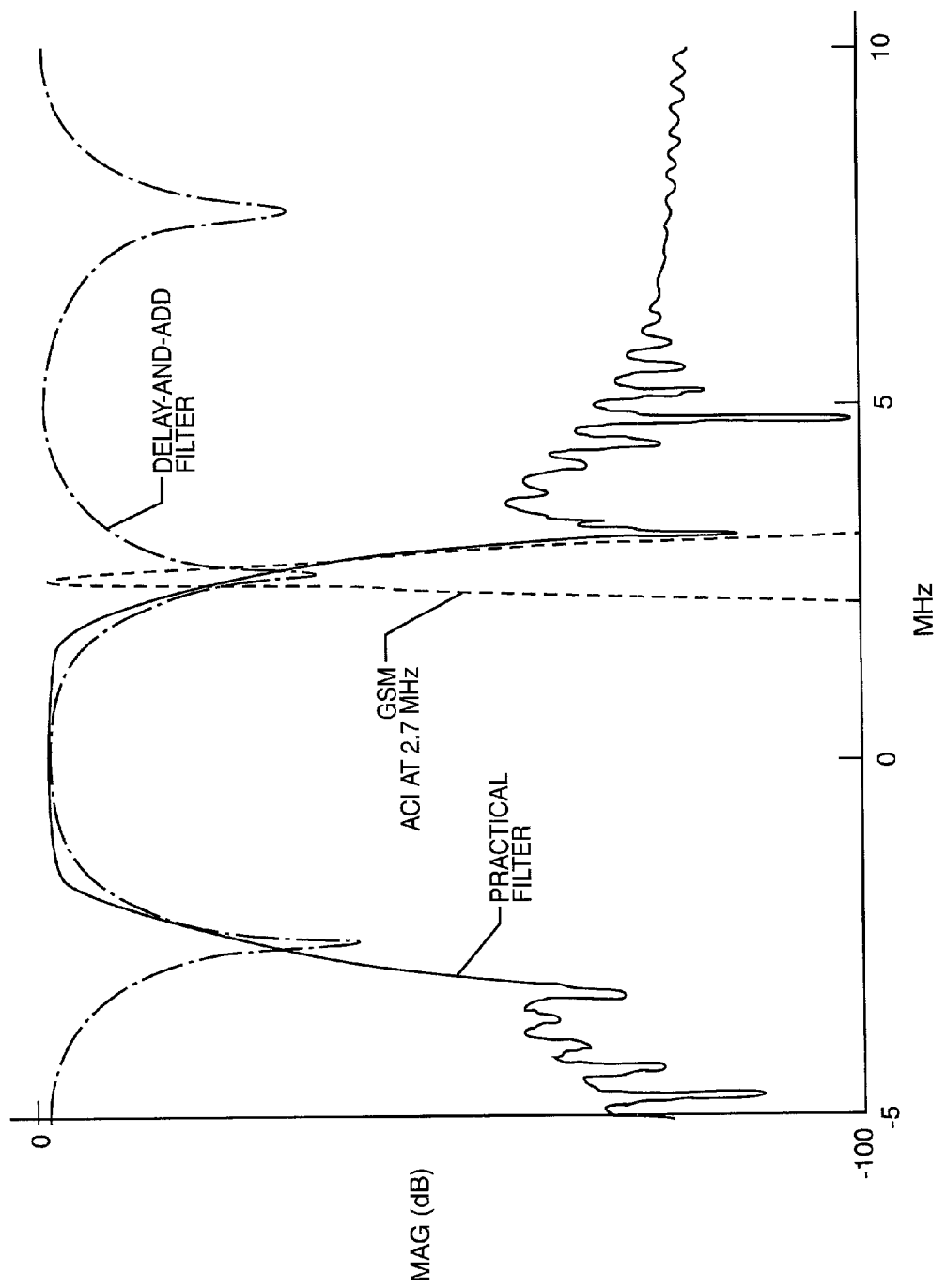
FIG. 4 is a graph of exemplary delay-and-add filter response for the filter of FIG. 3.

FIG. 3 illustrates an exemplary implementation of the filter 20, where the cumulative delay is N=3, or three times the sampling period T, where T equals $1/f_s$. Thus, the transfer function of filter 20 is expressed as $H(z)=1+z^{-3}$, which places filter nulls at $f_s/6$, $-f_s/6$, and $f_s/2$. With $f_s$ equal to four times the chip rate (4×3.84 MHz=15.36 MHz), this places a filter null at 2.56 MHz (15.36 MHz/6). From FIG. 1, this filter null substantially overlays the narrowband GSM signal positioned at 2.7 MHz. Thus, the filter 20 may be configured to position filter nulls at frequencies corresponding to expected or known points of narrowband interference in the wideband signal. FIG. 4 illustrates exemplary filter responses for this configuration, and particularly shows the characteristic filter notches associated with the delay-and-add filter 20.

For simplicity, FIG. 3 depicts only one input sample stream r, from which a delayed version d is derived. The delayed signal d is then combined with the original signal r to form the filtered signal f. It should be understood that filter 20 applies like filtering to both the I and Q input sample streams in the context of AT 10.

Filter 20 comprises one or more delay elements 40, shown here as three successive delay stages that impart a cumulative delay of three times the sampling period T. Filter 20 further comprises a switch 42, a combiner 44, and a control element 46. Switch 42 may be a digital switch implemented in hardware or software. Switch 42 selectively couples the delayed sample stream d into the combiner 44, which may be a digital adder, for example. When the combiner 44 receives both signals r and d, it outputs the filtered signal f, but when switch 42 uncouples signal d from the combiner 44, the combiner 44 simply passes through signal r. Thus, the output of the combiner 44 provides either r or f in dependence on operation of the switch 44.

The control element 46 controls operation of switch 42 such that selective filtering is applied to the sample stream r (e.g., the I/Q baseband signals in AT 10). Control element 46 may be a signal processor or other processing circuit, and may be incorporated into the baseband processor 22, for example.

Various techniques exist for controlling whether filtering is applied to the sample stream r. For example, within the context of W-CDMA, the data rate of the received signal may be used as a criteria for controlling the switch 42. As is understood in the art, the unit symbol time in W-CDMA varies with data rate. That is, lower data rates have a larger "spreading factor" than higher data rates. Higher spreading factors translate into longer effective symbol times.

To understand why use of the filter 20 might be avoided above certain data rates or spreading factors, it is helpful to recognize the time dispersion effects associated with combining delayed and non-delayed versions of the received signal r in the combiner 44. The delay element(s) 40 introduce symbol time dispersion in the amount of N×1/fs into the delayed signal d relative to the signal r. The extent to which this time dispersion is problematic with regard to Inter-Symbol Interference (ISI) depends on the relative magnitude of dispersion time to symbol time. Since the dispersion time (i.e., cumulative delay imparted by delay elements 40) is fixed, the extent of ISI caused by combining r and d varies with the spreading factor.

Figure 5A:
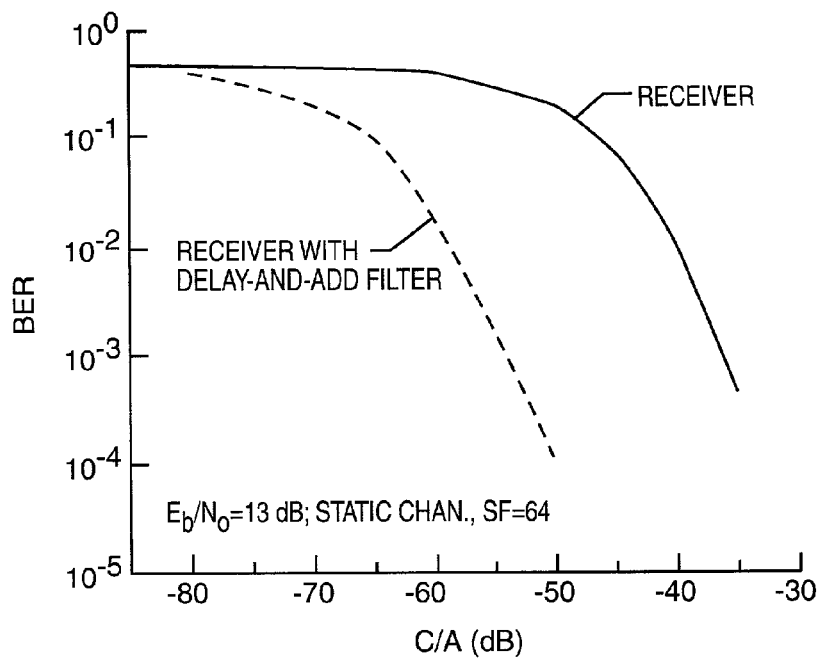
FIGS. 5A and 5B are graphs comparing filtered and non-filtered received signals at different W-CDMA spreading factors.
Figure 5B:
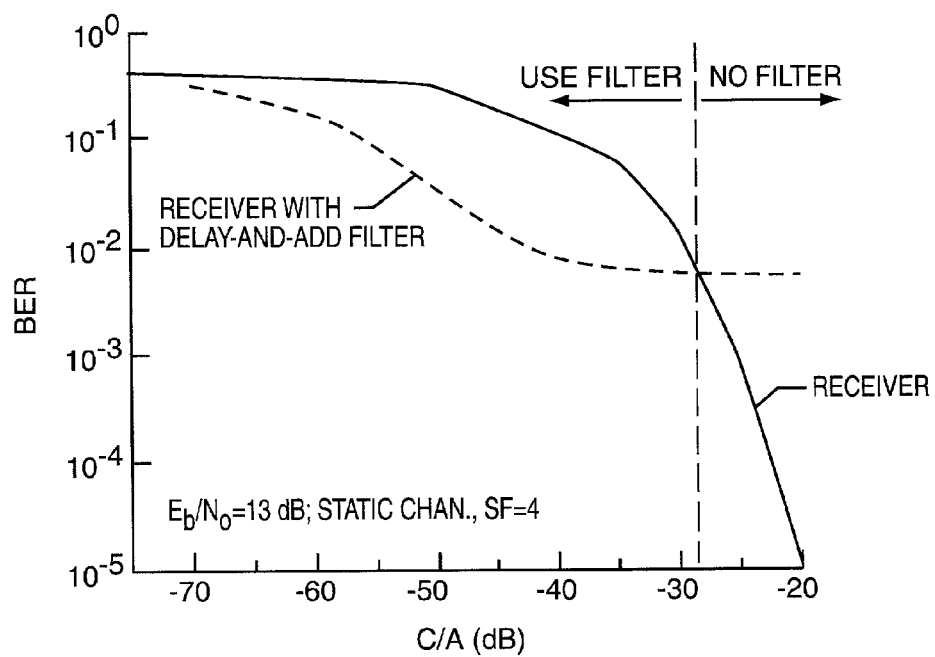

FIGS. 5A and 5B illustrate comparative performance of the filter 20 in an exemplary implementation of the receiver portion of AT 10. FIG. 5A plots bit error rate (BER) in the data extracted from the received baseband signal after filtering by filter 20 against carrier-to-adjacent channel interference (C/A) in dB for a spreading factor of sixty-four (64). Similarly, FIG. 5B plots the same curves for a spreading factor of four (4). In both graphs, the solid curve represents BER performance absent delay-and-add filtering, while the dashed curve represents BER performance with delay-and-add filtering by filter 20.

From the graphs, it may be seen that BER tends to be reduced with increasing levels of adjacent channel interference. However, FIG. 5B illustrates that for the lower spreading factor, the filtered and non-filtered performance curves cross at a C/A value of roughly 28 dB. Thus, in at least some embodiments, control element 44 may control selective delay-and-add filtering of the received signal based on measured interference rather than just spreading factor. With this combined approach, the AT 10 would apply delay-and-add filtering where such application improved signal reception (BER), and would forego delay-and-add filtering at other times.

Figure 6:
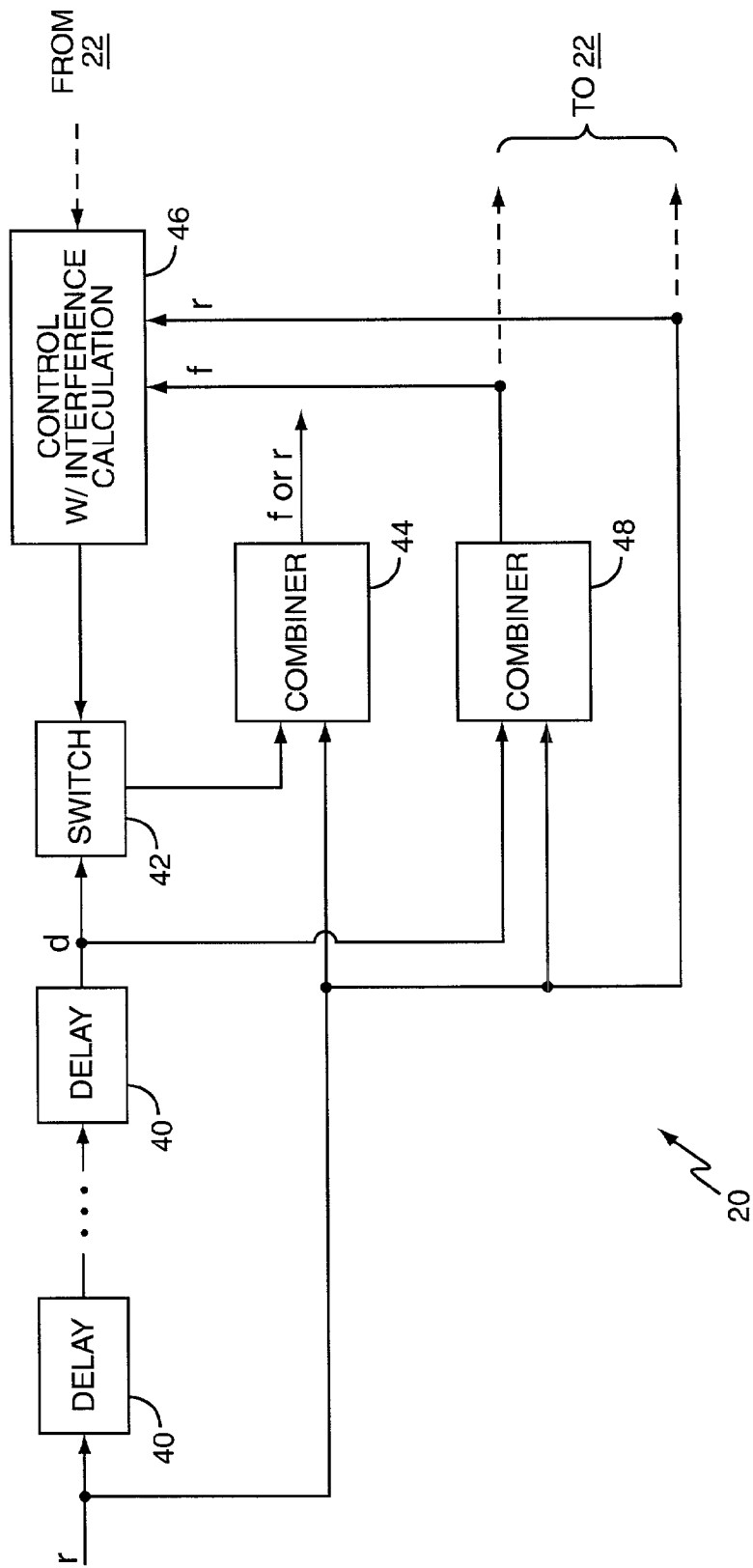
FIG. 6 is a diagram of another exemplary implementation of a delay-and-add filter.

FIG. 6 illustrates one approach to this more complex control of delay-and-add filtering. Here, the control element 46 receives as inputs the signal of interest r and the filtered version f of that signal. The filter 20 may include an additional combiner 48 to produce a second filtered signal f as a combination of r and d. By signals r and f, the control element 46 can determine whether or not to apply delay-and-add filtering to signal r. That is, if signal r exhibits lower interference than signal f, the control element 46 controls switch 42 to de-couple signal d from combiner 44 so that combiner 44 simply outputs signal r, which may then be used in subsequent baseband processing by baseband processor 22.

Conversely, if signal f exhibits lower interference than signal r, the control element 46 controls switch 42 to couple signal d into combiner 44, which then adds signals d and r to produce the filtered signal f. In this instance, signal f, with its reduced levels of interference, is used in subsequent baseband processing.

In general, the control element 46 controls selective filtering of signal r based on the data rate of signal r (e.g., known or expected symbol times, known spreading factors, etc.), based on the measured performance of delay-and-add filtering, or on some combination of these two approaches.

Where the control element 46 measures or is otherwise informed of relative interference levels between signals r and f, such measurements of interference may be based on a general carrier-to-interference (C/I) measurement, as is well understood in the art. More sophisticated measuring techniques might bias interference determination towards the portion of the wideband received signal where the narrowband interference is expected. Within the context of the W-CDMA example above, the control element 46 might measure the specific adjacent channel interference caused by the interfering GSM signal at or around the expected frequency of this interference. Further, the baseband processor 22 might be used to perform interference measurements on signals r and f, and then provide control information to the control element 46. In addition, as mentioned earlier, the control element 46 might comprise a portion of the baseband processor 22.

In a more general sense, any RF receiver may be configured to selectively apply delay-and-add filtering via filter 20, where the resultant narrowband filtering of the received signal might be expected to yield improvements in signal reception. Fundamentally, the approach to such filtering in at least some exemplary embodiments simply involves selecting the appropriate delay time such that the filter 20 properly positions the delay-and-add filter notches relative to the expected narrowband interference. Thus, the overall delay time imparted by the filter 20 to the delayed version of the received signal is set based on the desired frequencies of the filter notches. Of course, the sample rate of the received signal must be considered, since that rate determines the frequency spacing of the resultant notches.

It should be noted that the delay-and-add architecture is efficient in terms of computational operation and logical and/or physical implementation. Filter 20 may be realized in hardware using simple digital elements including switches, adders, and delay gates. Note that delay gates imply some form of clocking to shift the data along every data sample period, or every n data sample periods. Implemented in hardware, filter 20 can be easily adapted to operate at the frequencies attendant with W-CDMA baseband signal processing. Hardware implementations may entail a discrete approach, or may involve integrating the various elements of filter 20 into an ASIC or other digital logic circuit.

Where operating frequencies are reasonable relative to available processing resources, the filter 20 may be implemented in software for execution by baseband processor 22, or other processing element within AT 10. With this approach, it should be understood that FIG. 3 and other exemplary representations of the filter 20 discussed herein represent functional diagrams rather than literal schematic illustrations. Digital switch 42, adder 44, delay elements 40, and the other elements may all be implemented in program code.

Regardless of how the filter 20 is implemented, it may be of further use to point out that adjusting the sampling rate of the received signal may, in some instances, be helpful in shifting the filter notches closer to needed frequency values. For example, as the sampling frequency increases (e.g., 4×, 8×, 16× oversampling) the frequency spacing of resultant delay-and-add filter notches decreases. Thus, if a given sampling frequency and delay multiple combination does not yield a filter notch close enough to the frequency of an interfering signal, one may adjust the sampling frequency, adjust the delay time, or both.

While the above discussion focused on the utility of the present invention in the context of W-CDMA cellular receivers, it should be understood that the applicability of the present invention extends well beyond that framework. As emphasized earlier, the present invention provides efficient methods and apparatus for eliminating or substantially reducing one or more narrowband interfering signals from a wideband signal of interest. As such, the present invention is not limited by the preceding discussion rather it is limited only by the following claims, and the reasonable equivalents thereof.

What is claimed is:

1. An apparatus to filter a received signal, the apparatus comprising:
   at least one delay element to generate a delayed signal by delaying the received signal by a desired delay time; and
   a combiner to generate a filtered signal by combining the received signal with the delayed signal;
   said delay time of the at least one delay element configured to position a filter null substantially at the frequency of an expected interfering signal; and
   a switch positioned between the at least one delay element and the combiner to selectively couple the delayed signal into the combiner, such that the combiner outputs either the filtered signal or the received signal.

2. The apparatus of claim 1, further comprising a switch control element to control the switch.

3. The apparatus of claim 2, wherein the switch control element comprises a logic circuit to control the switch based on a data rate of the received signal, such that the delayed signal is coupled into the combiner when the data rate is below a defined threshold.

4. The apparatus of claim 2, wherein the switch control element comprises a logic circuit to control the switch based on a spreading factor of the received signal, such that the delayed signal is coupled into the combiner when the spreading factor is above a defined threshold.

5. The apparatus of claim 2, wherein the switch control element comprises at least one processor to control the switch based on comparing measured interference in the received signal and the filtered signal.

6. The apparatus of claim 5, wherein the at least one processor switches the delayed signal into the combiner if the filtered signal includes less interference than the received signal.

7. The apparatus of claim 1, wherein the switch comprises a digital switch.

8. The apparatus of claim 1, wherein the at least one delay element comprises a digital delay element.

9. The apparatus of claim 8, wherein the received signal is a W-CDMA signal and the expected interfering signal is a GSM signal transmitted at a frequency relatively close to a transmit frequency of the W-CDMA signal, and wherein the delay time is calculated to position the filter null substantially at a baseband offset frequency of the GSM signal relative to the W-CDMA signal.

10. A delay-and-add filter to filter narrowband interference from a relatively wideband received signal, the filter comprising:
    a digital delay element to produce a delayed signal at an output by delaying a received signal applied to an input, said digital delay element having a time delay calculated to position a filter null at a desired frequency corresponding to the narrowband interference; and
    a combining element to generate a filtered signal by combining the received signal and the delayed signal output from the digital delay element; and
    wherein the digital delay element comprises at least one delay stage that imparts a cumulative delay of $N \times 1/f_s$, where N is a desired multiple and $f_s$ is a sampling frequency of the received signal.

11. The delay-and-add filter of claim 10, wherein the received signal comprises a baseband W-CDMA signal having a chip rate of approximately 3.84 MHz and a sampling frequency $f_s$ that is four times the chip rate, and wherein the at least one delay stage imparts a cumulative delay of three times $1/f_s$, such that filter nulls are positioned at $f_s/6$, $-f_s/6$, and $f_s/2$.

12. The delay-and-add filter of claim 11, wherein the filter null for the delay time $f_s/6$ is offset relative to the W-CDMA received signal at approximately 2.6 MHz, and wherein the narrowband interference is an interfering GSM signal offset at approximately 2.7 MHz.

13. The delay-and-add filter of claim 10, further comprising a digital switch to selectively couple the delayed signal into the combiner such that in a first state of the digital switch the combining element outputs the filtered signal, and in a second state of the digital switch the combining element outputs the received signal.

14. The delay-and-add filter of claim 13, further comprising a control element to control the digital switch.

15. The delay-and-add filter of claim 14, wherein the control element comprises at least one processor to control the digital switch based on comparing interference in the received signal with interference in the filtered signal.

16. A W-CDMA receiver comprising:
    a receiver front-end to generate a baseband signal from a W-CDMA signal received at a given transmit frequency; and
    a delay-and-add filter to generate a filtered signal by applying a frequency null positioned at an expected interference frequency relative to the baseband signal, the delay-and-add filter comprising:
      a delay element to generate a delayed signal by imparting a desired time delay to the baseband signal; and
      a combiner to generate the filtered signal by combining the baseband signal with the delayed signal.

17. The W-CDMA receiver of claim 16, wherein the delay-and-add filter selectively couples the delayed signal to the combiner such that the combiner outputs either the baseband signal or the filtered signal.

18. The W-CDMA receiver of claim 17, further comprising a processor to control the selective coupling of the delayed signal to the combiner based on at least one characteristic of the baseband signal.

19. The W-CDMA receiver of claim 16, further comprising a digital switch to selectively couple the delayed signal to the combiner.

20. The W-CDMA receiver of claim 19, further comprising at least one processor to control the digital switch.

21. The W-CDMA receiver of claim 20, wherein the at least one processor controls the digital switch based on a spreading factor of the W-CDMA signal.

22. The W-CDMA receiver of claim 20, wherein the at least one processor controls the digital switch based on determining the efficacy of the delay-and-add filter.

23. The W-CDMA receiver of claim 22, wherein determining the efficacy of the delay-and-add filter comprises the at least one processor comparing interference in the baseband signal with interference in the filtered signal.

24. The W-CDMA receiver of claim 23, further comprising a second combiner receiving the baseband and delayed signals as inputs, and providing a second filtered signal as an output.

25. The W-CDMA receiver of claim 23, wherein the processor communicatively receives as inputs the second filtered signal and the baseband signal.

26. A method of filtering a relatively narrowband interfering signal from a wideband received signal, the method comprising:

generating a delayed signal by delaying the received signal by a delay time calculated to produce a delay-and-add filter null at an expected frequency of the interfering signal; and filtering the received signal by combining the received signal with the delayed signal to attenuate the interfering signal; and calculating the delay time based on a sampling frequency $f_s$ of the received signal and the expected frequency of the interfering signal.

27. The method of claim 26, wherein calculating the delay time comprises determining a multiple of the sampling period $1/f_s$ that positions a filter null at an offset frequency substantially at the expected frequency of the interfering signal.

28. The method of claim 26, wherein the received signal is a baseband W-CDMA signal and the interfering signal is a baseband GSM signal, the method further comprising calculating the delay time to position the filter null substantially at the expected frequency of the baseband GSM signal.

29. The method of claim 26, wherein filtering the received signal comprises selectively filtering the received signal by selectively combining the received signal with the delayed signal.

30. The method of claim 29, further comprising selectively filtering the received signal based on at least one characteristic of the received signal.

31. The method of claim 30, wherein the received signal is a W-CDMA signal, and selectively filtering the received signal comprises filtering the received signal only if a spreading factor of the received signal is above a defined threshold.

32. The method of claim 29, further comprising selectively filtering the received signal based on determining whether filtering reduces interference in the received signal.

33. The method of claim 32, further comprising comparing interference in the received signal with interference in the filtered signal to determine whether filtering reduces interference in the received signal.

34. The method of claim 29, further comprising controlling a digital switch to implement selective filtering of the received signal, wherein the digital switch receives the delayed signal and selectively outputs the delayed signal to a combiner based on a controlled state of the digital switch, and wherein the combiner combines the received signal with the output from the digital switch.

* * * * *